United States Patent [19]

Teraguchi

[11] Patent Number: 5,571,391
[45] Date of Patent: Nov. 5, 1996

[54] ELECTRODE STRUCTURE AND METHOD FOR FABRICATING THE SAME

[75] Inventor: Nobuaki Teraguchi, Nara-ken, Japan

[73] Assignee: Sharp Kabushiki Kaisha, Osaka, Japan

[21] Appl. No.: 502,349

[22] Filed: Jul. 14, 1995

[30] Foreign Application Priority Data

Jul. 15, 1994 [JP] Japan .................................. 6-164379

[51] Int. Cl.$^6$ ..................................................... C25B 11/00
[52] U.S. Cl. ................... 204/290 R; 427/576; 427/578; 427/123; 427/126.1; 427/226; 427/229; 427/255; 427/255.2
[58] Field of Search ........................ 204/290 R; 427/576, 427/578, 99, 123, 126.1, 126.3, 226, 229, 237, 238, 239, 248.1, 255, 255.2, 225.7

[56] References Cited

U.S. PATENT DOCUMENTS

| | | | |
|---|---|---|---|
| 4,663,191 | 5/1987 | Choi et al. | 427/93 |
| 4,708,904 | 11/1987 | Shimizu et al. | 427/96 |

FOREIGN PATENT DOCUMENTS 5-291621  11/1993  Japan .

OTHER PUBLICATIONS

Amano, H., et al., "P-type conduction in Mg-doped GaN treated with low-energy electron beam irradiation (LEEBI)" *Japanese Journal of Applied Physics* (1989) 28(12):L2112–L2114. No month available.

Lin, M. E., et al., "Low resistance ohmic contacts on wide band-gap GaN" *Appl. Phys. Lett.* (1994)64(8):1003–1005. No month available.

*Primary Examiner*—Bruce F. Bell
*Attorney, Agent, or Firm*—Morrison & Foerster LLP

[57] ABSTRACT

The electrode structure of the invention includes an n-type $Al_xGa_yIn_{1-x-y}N$ ($0 \leq x \leq 1$, $0 \leq y \leq 1$, $x+y \leq 1$) semiconductor layer and an electrode layer formed on the semiconductor layer. In the electrode structure, the electrode layer is made of a metal silicide and, when a metal contained in the metal silicide is nitrified, a free energy of the metal nitride becomes smaller than a free energy of the metal contained in the metal silicide.

6 Claims, 5 Drawing Sheets

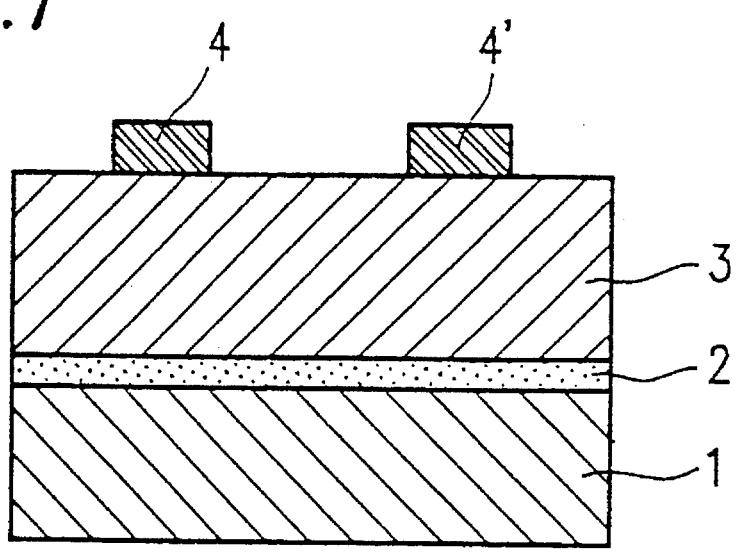

ELECTRODE STRUCTURE AND METHOD FOR FABRICATING THE SAME

BACKGROUND OF THE INVENTION

1. Field of the Invention

The present invention relates to an electrode structure for an n-type $Al_xGa_yIn_{1-x-y}N$ ($0 \leq x \leq 1$, $0 \leq y \leq 1$, $x+y \leq 1$) semiconductor device, one of the Group III-V compound semiconductor devices containing nitrides, and a method for fabricating the same. More specifically, the present invention relates to an electrode structure having a substantially ideal ohmic contact showing an extremely small contact resistance between a semiconductor layer and an electrode layer and exhibiting excellent thermal stability and a method for fabricating the same.

2. Description of the Related Art

Generally, in fabricating an electrode structure for an $Al_xGa_yIn_{1-x-y}N$ ($0 \leq x1$, $0 \leq y \leq 1$, $x+y \leq 1$) semiconductor device, nitrogen, one of the elements constituting the semiconductor, is likely to dissociate from the surface of a semiconductor layer in the electrode structure when the semiconductor layer is formed. Therefore, it is difficult to produce crystals satisfying a desirable stoichiometric ratio. When the dissociation of nitrogen generates the vacancies inside the crystal structure of the semiconductor layer, the conductivity type of the semiconductor layer turns into n-type. The resulting n-type semiconductor layer incorporates defective crystals. Thus, if a semiconductor device is fabricated by forming an electrode layer on such a semiconductor layer, the semiconductor device cannot exhibit satisfactory heat stability.

In recent years, the technologies for the crystal growth have been developed so as to considerably improve various characteristics of the resulting crystal structure. As a result, the number of the vacancies caused by the dissociation of the nitrogen atoms has been substantially reduced. In this case, the carrier density can be controlled by doping the semiconductor layer with an n-type impurity such as silicon (Si) and germanium (Ge), thereby obtaining crystals having a carrier density of about $10^{19}$ cm$^{-3}$. However, the carrier density at such a level is insufficient to form an ohmic contact between an electrode layer and the semiconductor layer in forming the electrode structure. Therefore, the development of a semiconductor layer having an even higher carrier density is eagerly demanded.

On the other hand, various electrode structures usable for Group III-V compound semiconductor devices containing nitrides such as blue-light-emitting diodes have been conventionally developed. In the proposed electrode structures, various kinds of metals are used to form the electrode layer. For example, in order to form the electrode layer for an n-type $Al_xGa_yIn_{1-x-y}N$ ($0 \leq x \leq 1$, $0 \leq y \leq 1$, $x+y \leq 1$) semiconductor device, aluminum (Al) is most commonly employed ("P-type Conduction in Mg-Doped GaN Treated with Low-Energy Electron Beam Irradiation", H. Amano et al., Jpn. J. Appl. Phys. 28 p. L2112 (1989)). Japanese Laid-Open Patent Publication No. 5-291621 discloses that chrome (Cr), titanium (Ti) and indium (In) are also usable as the metals for forming the electrode layer in place of Al. However, any of these metals for the electrode layer cannot solve the above-mentioned problems. The reason is as follows. Since a satisfactory carrier density cannot be obtained for the semiconductor layer even by the use of these metals for the electrode layer, a contact resistance between the semiconductor layer and the electrode layer increases. In addition, in the electrode structure using these metals for the electrode layer, crystals having an inappropriate stoichiometric ratio are formed in the interface between the semiconductor layer and the electrode layer in some cases. As a result, the electrode structure using these metals for the electrode layer sometimes exhibits unsatisfactory heat stability and high-temperature resistivity. Consequently, these metals for the electrode layer cannot be suitably used as the materials for the electrode layer in the electrode structure for the semiconductor device.

In consideration of these conventional problems, an electrode structure for an n-type semiconductor device having an ideal ohmic contact showing an extremely small contact resistance between a semiconductor layer and an electrode layer and exhibiting excellent thermal stability is eagerly demanded.

SUMMARY OF THE INVENTION

The electrode structure of the invention includes an n-type $Al_xGa_yIn_{1-x-y}N$ ($0 \leq x \leq 1$, $0 \leq y \leq 1$, $x+y \leq 1$) semiconductor layer and an electrode layer formed on the semiconductor layer. In the electrode structure, the electrode layer is made of a metal silicide and, when a metal contained in the metal silicide is nitrified, a free energy of the metal nitride becomes smaller than a free energy of the metal contained in the metal silicide.

In one embodiment, the metal silicide is selected from a group consisting of $CrSi_2$, $MoSi_2$, $NbSi_2$, $TaSi_2$, $TiSi_2$, $VSi_2$ and $WSi_2$.

In another embodiment, a stoichiometric ratio of the metal silicide is within a range of about 0.8:2 to about 1.2:2.

According to another aspect of the invention, a method for fabricating an electrode structure is provided. The method includes a step of forming an electrode layer on an n-type $Al_xGa_yIn_{1-x-y}N$ ($0 \leq x \leq 1$, $0 \leq y \leq 1$, $x+y \leq 1$) semiconductor layer. The electrode layer is made of a metal silicide and, when a metal contained in the metal silicide is nitrified, a free energy of the metal nitride becomes smaller than a free energy of the metal contained in the metal silicide by 0 kcal/mol or less.

In one embodiment, the method further includes a step of heat-treating the semiconductor layer and the electrode layer after the electrode layer is formed.

In another embodiment, the annealing temperature is in a range of about 100° C. to about 1000° C.

Thus, the invention described herein makes possible the advantages of (1) providing an electrode structure having an ideal ohmic contact showing an extremely small contact resistance between a semiconductor layer and an electrode layer; (2) providing an electrode structure including a semiconductor layer having a carrier density high enough to realize such an ideal ohmic contact; (3) providing an electrode structure exhibiting excellent thermal stability; (4) providing an electrode structure in which crystals having an appropriate stoichiometric ratio are formed at the interface between the semiconductor layer and the electrode layer; and (5) providing a method for fabricating such an electrode structure.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view schematically showing an electrode structure according to an example of the present invention.

DESCRIPTION OF THE PREFERRED EMBODIMENTS

Figure 2A:
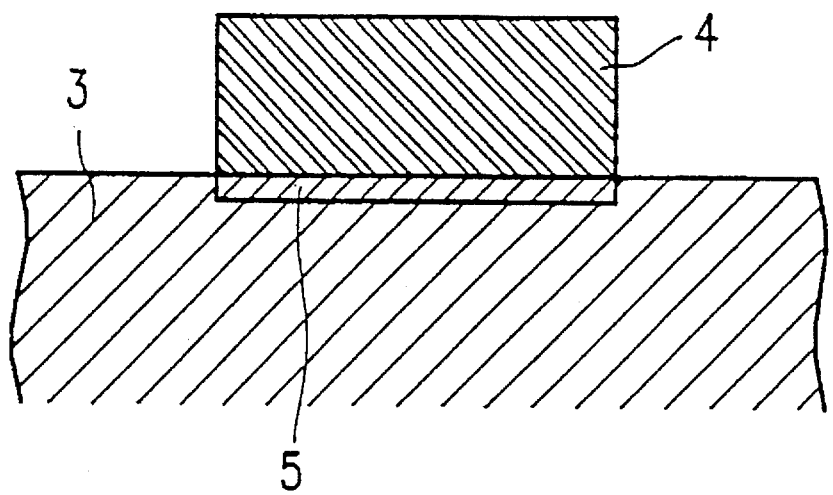
FIGS. 2A and 2B are enlarged cross-sectional views showing the respective interface portions between the electrode layer and the semiconductor layer in the electrode structure shown in FIG. 1.

An exemplary electrode structure and an exemplary method for fabricating the same according to the present invention will be described below with reference to FIG. 1 and FIGS. 2A and 2B.

As shown in FIG. 1, the electrode structure of the invention includes: a buffer layer 2; a semiconductor layer 3; and electrode layers 4 and 4' on a substrate 1 in this order.

The substrate 1 can be made of sapphire, SiC or the like. The thickness of the substrate 1 is preferably in the range of 10 to 500 μm, and more preferably in the range of 100 to 300 μm.

The buffer layer 2 can be made of GaN, AlN or the like. The buffer layer 2 can be formed on the substrate 1 by a MOCVD method or the like. The thickness of the buffer layer 2 is preferably in the range of 10 to 100 nm, and more preferably in the range of 10 to 50 nm.

The semiconductor layer 3 can be made of an n-type $Al_xGa_yIn_{1-x-y}N$ ($0 \leq x \leq 1$, $0 \leq y \leq 1$, $x+y \leq 1$) semiconductor. The semiconductor layer 3 can be formed on the buffer layer 2 by a MOCVD method or the like. The thickness of the semiconductor layer 3 is preferably in the range of 2 to 6 μm, and more preferably in the range of 3 to 5 μm. The carrier density of the semiconductor constituting the semiconductor layer 3 is preferably in the range of $10^{18}$ to $10^{20}$ cm$^{-3}$, and more preferably in the range of $10^{19}$ to $10^{20}$ cm$^{-3}$. The conductivity type of the semiconductor layer 3 can be controlled by doping the semiconductor layer 3 with an n-type impurity such as Si and Ge.

The electrode layers 4 and 4' can be made of a metal silicide containing a metal, whose free energy is reduced when the metal is nitrified. More specifically, such metal silicides include: $CrSi_2$, $MoSi_2$, $NbSi_2$, $TaSi_2$, $TiSi_2$, $VSi_2$ and $WSi_2$. The following Table 1 shows the variation of the free energy of the respective metals contained in these metal silicides when the metals are nitrified.

TABLE 1

| Metal | The variation amount of the free energy (kcal/mol) |
| --- | --- |
| Cr | −24 |
| Mo | −12 |
| Nb | −51 |
| Ta | −54 |
| Ti | −74 |
| V | −28 |
| W | −11 |

The stoichiometric ratio of a metal to Si in these metal silicides is not always required to be exactly 1:2. According to the present invention, the stoichiometric ratio is preferably in the approximate range of 0.8:2 to 1.2:2.

The thickness of the electrode layers 4 and 4' is preferably in the range of 10 to 500 nm, and more preferably in the range of 100 to 200 nm. The cross-sectional shape of the electrode layers 4 and 4' may be an arbitrary shape, e.g., circular, rectangular, polygonal, or the like. For example, in the case where the electrode layers 4 and 4' have a circular cross section, i.e., in the case where the electrodes are cylindrical, the diameter of the cross section is preferably in the range of 50 to 500 μm, and the distance between the centers of the two cylindrical electrodes is preferably in the range of 0.5 to 2 mm. However, these values are variable depending upon the applications thereof.

The electrode layers 4 and 4' can be formed by an electron beam evaporation method, a sputtering method or the like. For example, in the case where the electrode layers 4 and 4' are formed by the electron beam evaporation method, the ultimate background pressure is preferably $1 \times 10^{-8}$ Torr or less, and the pressure during the deposition is preferably $1 \times 10^{-7}$ Torr or less.

The electrode layers 4 and 4' may be formed by simultaneously depositing the metal and Si on the semiconductor layer, or the electrode layers 4 and 4' may also be formed by alternately depositing the metal and Si on the semiconductor layer and then by generating a metal silicide by annealing. In the latter case, the annealing temperature is preferably in the range of 100° to 1000° C., and the annealing time is preferably in the range of 5 to 30 minutes. By performing the annealing under these conditions, a metal silicide having a desired stoichiometric ratio can be obtained.

In a preferred embodiment, after the electrode layers 4 and 4' are formed, an annealing is performed. The annealing can be performed by an electric furnace annealing method, a rapid thermal annealing (RTA) method or the like. The annealing temperature is preferably in the range of 100° to 1000° C., and more preferably in the range of 100° to 500° C. Although the annealing time is variable depending upon the annealing temperature, the time is preferably in the range of 5 to 30 minutes, and more preferably in the range of 5 to 10 minutes. By performing the annealing under these conditions, the reaction at the interface between the semiconductor layer and the electrode layer is enhanced and the ohmic characteristics of the electrode structure are further improved.

Next, referring to FIGS. 2A and 2B, the interface portions between the semiconductor layer 3 and the electrode layers 4 and 4' (herein, only the interface between the semiconductor layer 3 and the electrode layer 4 will be described for simplification) will be briefly described below. FIGS. 2A and 2B are enlarged cross-sectional views showing the interface portions between the semiconductor layer 3 and the electrode layer 4.

Figure 2B:
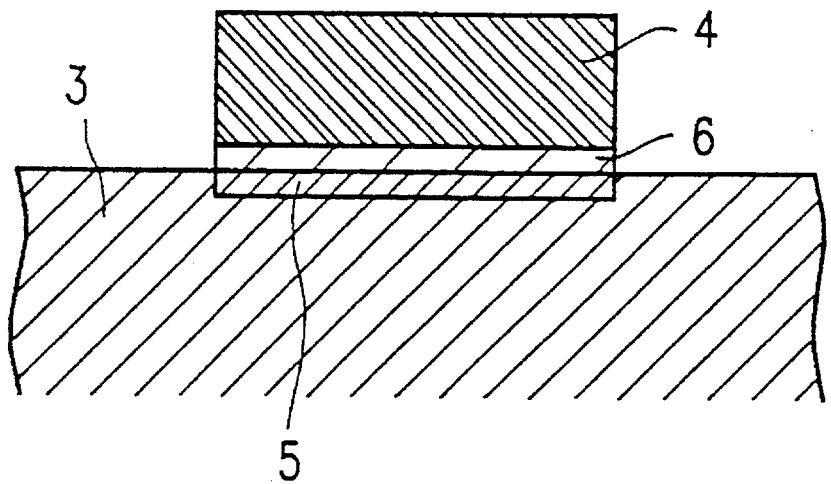

As shown in FIG. 2A, a semiconductor layer 5 having a high carrier density (an n$^+$-$Al_xGa_yIn_{1-x-y}N$:Si ($0 \leq x \leq 1$, $0 \leq y \leq 1$, $x+y \leq 1$) semiconductor layer: hereinafter, this layer will be called a "contact layer") is formed at the interface portion between the semiconductor layer 3 and the electrode layer 4 in the electrode structure thus obtained. Or, as shown in FIG. 2B, a contact layer 5 and a nitride layer 6 are formed at the interface portion. The mechanism for forming the nitride layer 6 is not clear. However, the mechanism seems to depend upon the amount of nitrogen contained in the semiconductor layer 3.

The carrier density of the contact layer 5 becomes larger than the carrier density of the semiconductor layer 3 before the electrode layer 4 is formed. That is to say, by forming the contact layer 5, it is possible to realize an ideal ohmic contact showing an extremely small contact resistance in the interface between the semiconductor layer 3 and the electrode layer 4. Specifically, the carrier density of the contact layer 5 is preferably in the range of $10^{18}$ to $10^{20}$ cm$^{-3}$, and more preferably in the range of $10^{19}$ to $10^{20}$ cm$^{-3}$.

According to the present invention, it is possible to realize an ideal ohmic contact showing an extremely small contact resistance at the interface between the semiconductor layer 3 and the electrode layer 4. This effect can be obtained based on the following mechanism. Silicon (Si), one of the elements constituting the metal silicide to be used for the electrode layer, functions as a satisfactory n-type impurity in an n-type $Al_xGa_yIn_{1-x-y}N$ ($0 \leq x \leq 1$, $0 \leq y \leq 1$, $x+y \leq 1$) semiconductor layer. In other words, the existence of silicon, i.e., a satisfactory n-type impurity, at the interface between the semiconductor layer 3 and the electrode layer 4 remarkably increases the carrier density at the interface between the semiconductor layer 3 and the electrode layer 4 as compared with the natural carrier density of this semiconductor layer 3. As a result, a contact layer 5 having a high carrier density is formed at the interface between the semiconductor layer 3 and the electrode layer 4 as shown in FIG. 2A or 2B. The existence of the contact layer 5 thus formed considerably reduces the width of the potential barrier in the interface between the semiconductor layer 3 and the electrode layer 4, thereby abruptly increasing the tunnel current flowing through the interface. As a result, the contact resistance between the semiconductor layer 3 and the electrode layer 4 becomes extremely small, and therefore a substantially ideal ohmic contact is realized.

In addition, according to the present invention, a particular metal, i.e., a metal whose free energy is reduced when the metal is nitrified, is used as the other element constituting the metal silicide. The metal silicide formed as the electrode layer on the semiconductor layer 3 effectively attracts the nitrogen atoms existing inside the semiconductor layer 3 to the interface between the semiconductor layer 3 and the electrode layer 4 owing to the negative variation of the free energy of the metal. Accordingly, even if the nitrogen atoms dissociate from the semiconductor layer 3 while the semiconductor layer 3 is being formed, so as to form the vacancies in the semiconductor layer 3, especially in the vicinity of the surface of the semiconductor layer 3, the nitrogen atoms attracted to the vicinity of the interface by the metal compensate for the vacancies by filling them. Consequently, crystals having an appropriate stoichiometric ratio can be formed at the interface between the semiconductor layer 3 and the electrode layer 4. As a result, it is possible to remarkably improve the thermal stability of the resulting electrode structure.

Such an electrode structure has excellent thermal stability and can be heat-treated at a high temperature, e.g., about 1000° C. Thus the annealing can be performed more effectively, so that the ohmic characteristics are further improved.

Hereinafter, the present invention will be described by way of illustrative examples with reference to the accompanying drawings. It is noted that the present invention is not limited to the following specific examples.

EXAMPLE 1

In the first example, an electrode structure as shown in FIG. 1 is fabricated in the following way.

First, a buffer layer 2 made of GaN (thickness: 50 nm) is formed by a MOCVD method on a sapphire substrate 1. Next, a semiconductor layer 3 made of an Si-doped n-type GaN (thickness: 3 µm) is formed on the buffer layer 2 by a MOCVD method. The carrier density of the n-type GaN semiconductor is $1 \times 10^{19}$ cm$^{-3}$. The electrode layers 4 and 4' made of Nb silicide (thickness: 50 nm) are then formed on the semiconductor layer 3 inside a vacuum deposition apparatus by an electron beam vapor deposition method. In this case, the ultimate vacuum degree is $1 \times 10^{-8}$ Torr, and the vacuum degree at the deposition is $1 \times 10^{-7}$ Torr. Ni and Si are deposited simultaneously. The electrode layers 4 and 4' thus formed have a circular cross section having a diameter of 500 µm. The distance between the centers of these two cylindrical electrodes is 1 mm.

Figure 3:
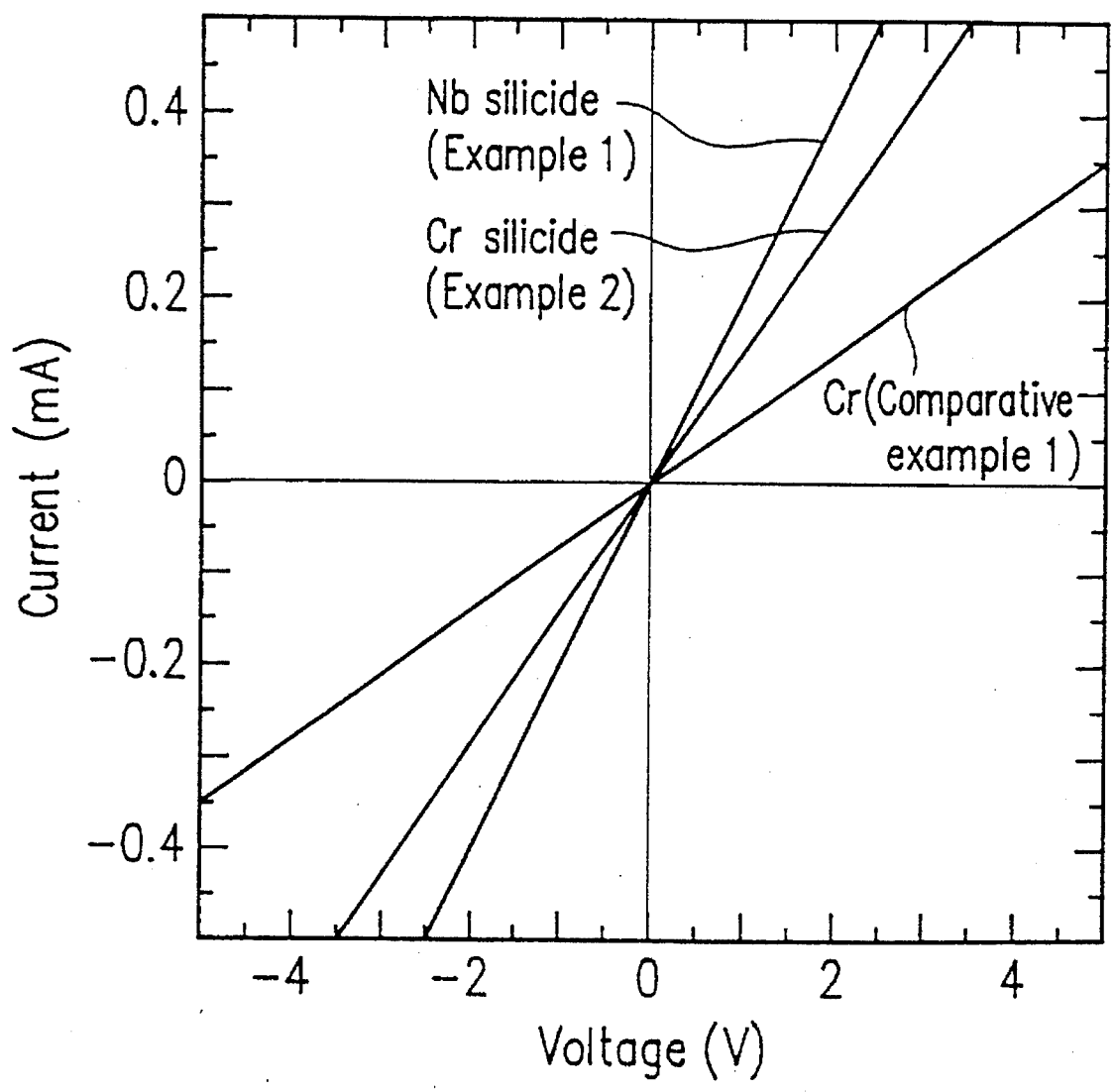
FIG. 3 is a graph showing current-voltage characteristics of the respective electrode structures of Examples 1 and 2 and Comparative Example 1.

FIG. 3 shows the resulting current-voltage characteristics between the electrode layers 4 and 4' of this electrode structure. The heat stability of this electrode structure is then compared with the heat stability of the electrode structure of Comparative Example 1 to be described later.

EXAMPLE 2

In the second example, an electrode structure as shown in FIG. 1 is fabricated in the same way as in the first example, except that Cr silicide is used instead of Nb silicide as the electrode layers 4 and 4'. FIG. 3 also shows the resulting current-voltage characteristics between the electrode layers 4 and 4' of the electrode structure of this example, along with the results of the first example. The heat stability of this electrode structure is also compared with the heat stability of the electrode structure of Comparative Example 1 described below.

Comparative Example 1

In this comparative example, an electrode structure as shown in FIG. 1 is fabricated in the same way as in the first example, except that Cr is used instead of Nb silicide as the electrode layers 4 and 4'. This electrode structure corresponds to one of the electrode structures exhibiting excellent ohmic characteristics disclosed in Japanese Laid-Open Patent Publication No. 5-291621. FIG. 3 also shows the resulting current-voltage characteristics between the electrode layers 4 and 4' of the electrode structure of this comparative example, along with the results of the above-mentioned Examples 1 and 2. The thermal stability of this electrode structure is then compared with the heat stabilities of the electrode structures of Examples 1 and 2.

As is apparent from FIG. 3, the electrode structures of Examples 1 and 2 according to the present invention exhibit much more satisfactory ohmic characteristics as compared with those of Comparative Example 1. In particular, the electrode structure of Example 1 exhibits excellent ohmic characteristics. In addition, the heat stabilities of the electrode structures of Examples 1 and 2 are superior to that of the electrode structure of Comparative Example 1.

EXAMPLE 3

Figure 4:
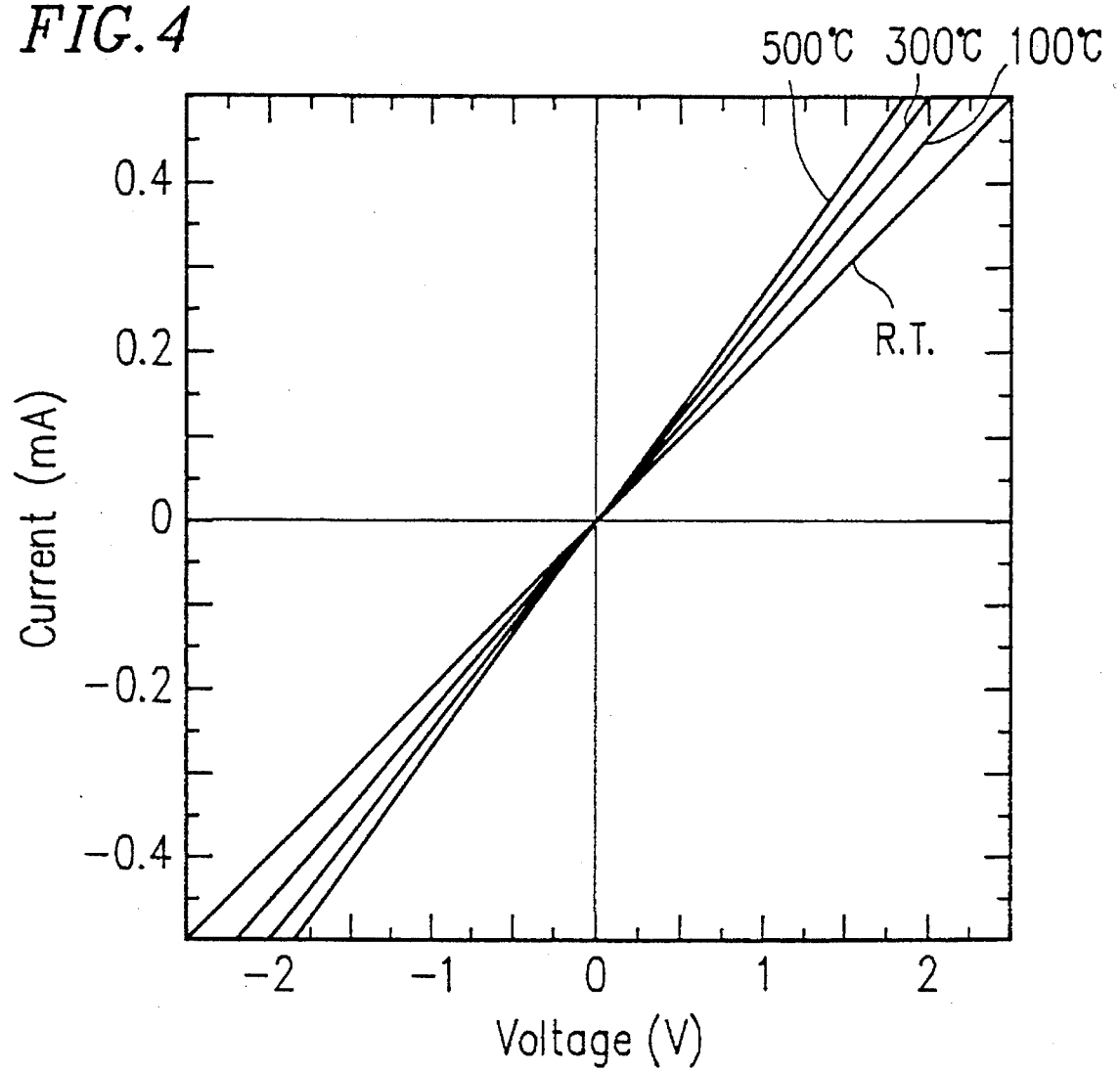
FIG. 4 is a graph showing the dependence of the current-voltage characteristics of the electrode structure of Example 1 upon the annealing temperature.

The effect of the annealing process on the electrode structure is inspected in the following manner. The electrode structure obtained in Example 1 is annealed in an electric furnace. The annealing process is performed three times at temperatures of 100° C., 300° C. and 500° C., respectively. The annealing time is set to be 5 minutes in any of these annealing processes. FIG. 4 shows the respective current-voltage characteristics of the electrode structure annealed at the three temperatures and those of the electrode structure of Example 1 which is not annealed.

As is apparent from FIG. 4, the annealing process improves the ohmic characteristics. The result shown in FIG. 4 also indicates that the higher the annealing temperature is, the more satisfactory the ohmic characteristics become, and that the electrode structure according to the present invention exhibits an excellent heat stability. More specifically, the crystal structure in the vicinity of the interfaces between the semiconductor layer 3 and the metal silicide layers 4 and 4' in this electrode structure can be annealed at 500° C.

EXAMPLE 4

Figure 5:
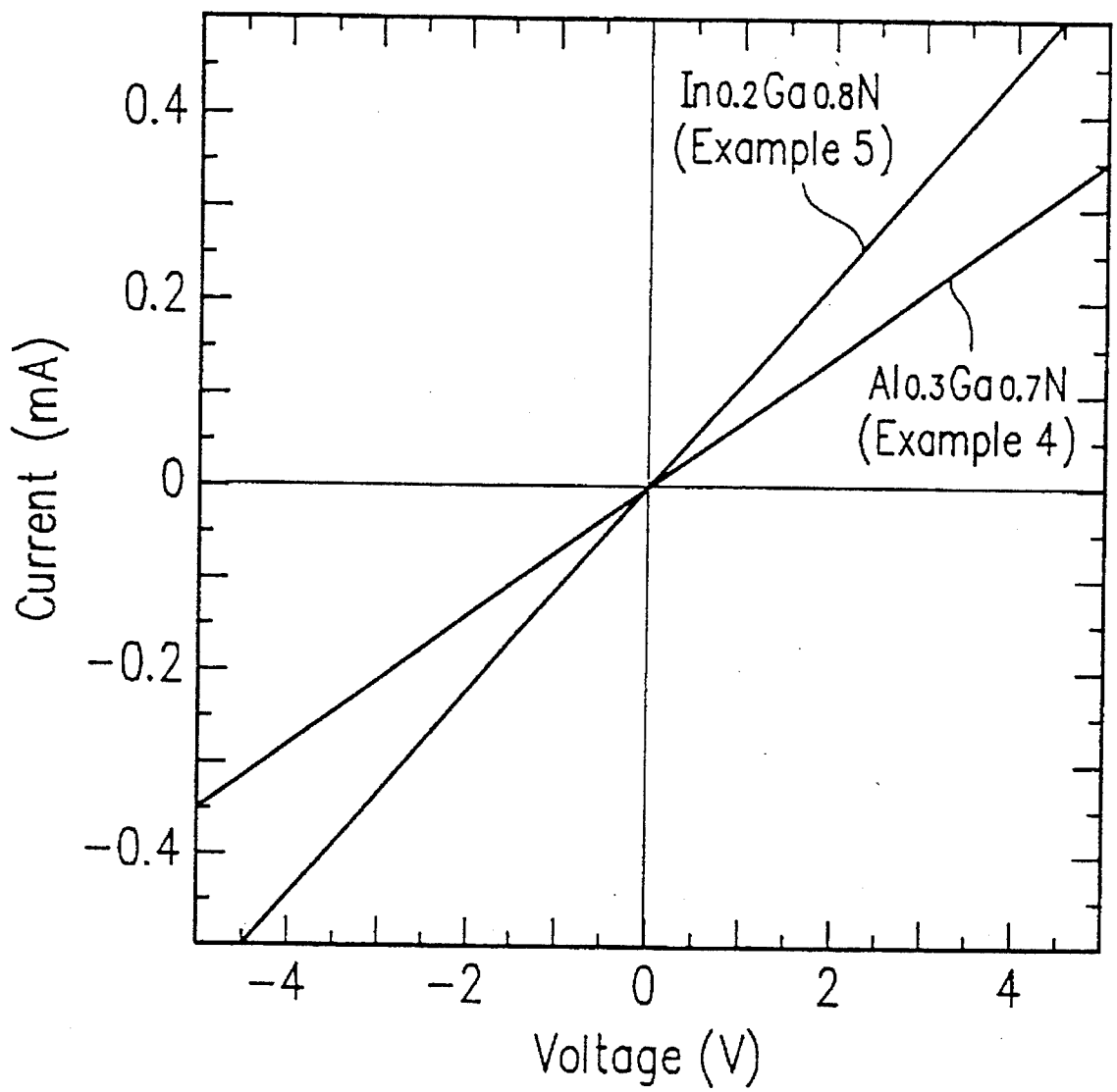
FIG. 5 is a graph showing current-voltage characteristics of the electrode structures of Examples 4 and 5.

In the fourth example, an electrode structure as shown in FIG. 1 is fabricated in the same way as in the first example, except that $Al_{0.3}Ga_{0.7}N$ having a carrier density of $5 \times 10^{18}$ cm$^{-3}$ is used instead of GaN as the semiconductor layer 3, and that Ti silicide is used instead of Nb silicide as the electrode layers 4 and 4'. FIG. 5 shows the resulting current-voltage characteristics between the electrode layers 4 and 4' of the electrode structure of this example.

EXAMPLE 5

In the fifth example, an electrode structure as shown in FIG. 1 is fabricated in the same way as in the fourth example, except that $In_{0.2}Ga_{0.8}N$ having a carrier density of $5 \times 10^{18}$ cm$^{-3}$ is used instead of $Al_{0.3}Ga_{0.7}N$ as the semiconductor layer 3. FIG. 5 also shows the resulting current-voltage characteristics between the electrode layers 4 and 4' of the electrode structure of this example.

As is apparent from FIG. 5, both the electrode structures obtained in Examples 4 and 5 exhibit satisfactory ohmic characteristics. In particular, the electrode structure obtained in Example 5 exhibits excellent ohmic characteristics.

As described above, according to the present invention, it is possible to obtain an electrode structure having a substantially ideal ohmic contact showing an extremely small contact resistance between the semiconductor layer and the electrode layer. In addition, crystals having an appropriate stoichiometric ratio are formed in the interface between the semiconductor layer and the electrode layer, so that an electrode structure excellent in the thermal stability can be obtained.

By using such an electrode structure, a semiconductor device operating at a lower operational voltage and exhibiting better thermal stability, e.g., a blue-light-emitting diode, can be obtained as compared with the case of using a conventional electrode structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electrode structure comprising an n-type $Al_xGa_yIn_{1-x-y}N$ ($0 \leq x \leq 1$, $0 \leq y \leq 1$, $x+y \leq 1$) semiconductor layer and an electrode layer formed on the semiconductor layer, wherein the electrode layer is made of a metal silicide and, when a metal contained in the metal silicide is nitrified, a free energy of the metal nitride becomes smaller than a free energy of the metal contained in the metal silicide.

2. An electrode structure according to claim 1, wherein the metal silicide is selected from a group consisting of $CrSi_2$, $MoSi_2$, $NbSi_2$, $TaSi_2$, $TiSi_2$, $VSi_2$ and $WSi_2$.

3. An electrode structure according to claim 2, wherein a stoichiometric ratio of the metal silicide is within a range of 0.8:2 to 1.2:2.

4. A method for fabricating an electrode structure comprising a step of forming an electrode layer on an n-type $Al_xGa_yIn_{1-x-y}N$ ($0 \leq x \leq 1$, $0 \leq y \leq 1$, $x+y \leq 1$) semiconductor layer, wherein the electrode layer is made of a metal silicide and, when a metal contained in the metal silicide is nitrified, a free energy of the metal nitride becomes smaller than a free energy of the metal contained in the metal silicide.

5. A method for fabricating an electrode structure according to claim 4 further comprising a step of annealing the semiconductor layer and the electrode layer after the electrode layer is formed.

6. A method for fabricating an electrode structure according to claim 5, wherein the annealing temperature is in a range of 100° C. to 1000° C.

* * * * *